United States Patent
Iijima et al.

(10) Patent No.: US 9,443,937 B2
(45) Date of Patent: Sep. 13, 2016

(54) SEMICONDUCTOR DEVICE

(71) Applicant: Kabushiki Kaisha Toshiba, Minato-ku (JP)

(72) Inventors: Ryosuke Iijima, Setagaya (JP); Teruyuki Ohashi, Kawasaki (JP); Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/807,369

(22) Filed: Jul. 23, 2015

(65) Prior Publication Data
US 2016/0087044 A1    Mar. 24, 2016

(30) Foreign Application Priority Data

Sep. 19, 2014    (JP) ................................. 2014-191061

(51) Int. Cl.
*H01L 29/15* (2006.01)
*H01L 29/16* (2006.01)
(Continued)

(52) U.S. Cl.
CPC ......... *H01L 29/1608* (2013.01); *H01L 29/045* (2013.01); *H01L 29/086* (2013.01);
(Continued)

(58) Field of Classification Search
CPC .................................................. H01L 29/045
USPC ....................................................... 257/628
See application file for complete search history.

(56) References Cited

U.S. PATENT DOCUMENTS 7,728,336 B2 *  6/2010  Yatsuo ................. H01L 29/086
                                                257/77
8,450,750 B2 *  5/2013  Honaga ................ H01L 21/049
                                                257/77

(Continued)

FOREIGN PATENT DOCUMENTS

JP        2009-117593       5/2009
JP        2010-123857       6/2010

(Continued)

OTHER PUBLICATIONS

Extended Search Report issued Mar. 1, 2016 in European Patent Application No. 15173935.6.

(Continued)

*Primary Examiner* — Chandra Chaudhari
(74) *Attorney, Agent, or Firm* — Oblon, McClelland, Maier & Neustadt, L.L.P

(57) ABSTRACT

A semiconductor device according to an embodiment includes a SiC layer including a first region provided at a surface. The first region satisfies $N_A-N_D<5\times10^{15}$ cm$^{-3}$ when a concentration of a p-type impurity is denoted by $N_A$, whereas a concentration of an n-type impurity is denoted by $N_D$. The surface is inclined at 0 degrees or more and 10 degrees or less to a {000-1} face, or the surface having a normal direction inclined at 80 degrees or more and 90 degrees or less to a <000-1> direction. The device includes a gate electrode, a gate insulating film provided between the SiC layer and the gate electrode, and a second region provided between the first region and the gate insulating film. The second region has a nitrogen concentration higher than $1\times10^{22}$ cm$^{-3}$.

10 Claims, 13 Drawing Sheets

(51) Int. Cl.
*H01L 29/51* (2006.01)
*H01L 29/739* (2006.01)
*H01L 29/78* (2006.01)
*H01L 29/04* (2006.01)
*H01L 29/08* (2006.01)
*H01L 29/10* (2006.01)
*H01L 29/94* (2006.01)

(52) U.S. Cl.
CPC ........... *H01L29/1095* (2013.01); *H01L 29/51* (2013.01); *H01L 29/518* (2013.01); *H01L 29/7395* (2013.01); *H01L 29/7802* (2013.01); *H01L 29/7828* (2013.01); *H01L 29/7813* (2013.01); *H01L 29/94* (2013.01)

(56) References Cited

U.S. PATENT DOCUMENTS

| 8,933,463 | B2 | 1/2015 | Adachi et al. |
| 2009/0114969 | A1 | 5/2009 | Suzuki et al. |
| 2012/0139623 | A1 | 6/2012 | Hashimoto et al. |
| 2012/0199846 | A1 | 8/2012 | Shimizu et al. |
| 2014/0167073 | A1 | 6/2014 | MacMillan |
| 2015/0303271 | A1 | 10/2015 | Tanaka et al. |

FOREIGN PATENT DOCUMENTS

| JP | 2011-49407 | 3/2011 |
| JP | 2012-104856 | 5/2012 |
| JP | 2012-164788 | 8/2012 |
| WO | WO 2014/103186 A1 | 7/2014 |

OTHER PUBLICATIONS

T. Kimoto, et al., "Improved Dielectric and Interface Properties of 4H-SiC MOS Structures Processed by Oxide Deposition and $N_2O$ Annealing", Silicon Carbide and Related Materials 2005, Materials Science Forum vol. 527-529, Oct. 2006, XP055250285, pp. 987-990.

Zengjun Chen, et al., "Kinetics of nitrogen incorporation at the $SiO_2$/4H-SiC interface during an NO passivation", Applied Surface Science 317, 2014, vol. 317, XP029081209, pp. 593-597.

Kung-Yen Lee, et al., "Influence of low temperature oxidation and nitrogen passivation on the MOS interface of C-face 4H-SiC", Applied Surface Science 282, 2013, vol. 282, XP028684515, pp. 126-132.

\* cited by examiner

SEMICONDUCTOR DEVICE

CROSS-REFERENCE TO RELATED APPLICATION

This application is based upon and claims the benefit of priority from Japanese Patent Application No. 2014-191061, filed on Sep. 19, 2014, the entire contents of which are incorporated herein by reference.

FIELD

Embodiments described herein relate generally to a semiconductor device.

BACKGROUND

SiC (silicon carbide) has been expected as a material for next-generation semiconductor devices. SiC has excellent physical properties of triple bandgap, approximately decuple breakdown field strength, and approximately triple thermal conductivity as compared with Si (silicon). The utilization of the properties can achieve semiconductor devices capable of high-temperature operation with low loss.

In the case of manufacturing a MISFET (Metal Insulator Semiconductor Field Effect Transistor) with the use of SiC, the C face channel can achieve a higher mobility as compared with a case of the Si face channel. However, the C face channel has the problem of increasing the leakage current through a gate insulating film as compared with a case of the Si face channel.

DETAILED DESCRIPTION

A semiconductor device according to an embodiment includes: a SiC layer including a first region provided at a surface, the first region satisfies $N_A-N_D<5\times10^{15}$ cm$^{-3}$ when a concentration of a p-type impurity is denoted by $N_A$, whereas a concentration of an n-type impurity is denoted by $N_D$, the surface being inclined at 0 degrees or more and 10 degrees or less to a {000-1} face, or the surface having a normal direction inclined at 80 degrees or more and 90 degrees or less to a <000-1> direction; a gate electrode; a gate insulating film provided between the SiC layer and the gate electrode; and a second region provided between the first region and the gate insulating film, the second region having a nitrogen concentration higher than $1\times10^{22}$ cm$^{-3}$.

Embodiments of the present disclosure will be described with reference to the drawings. It should be noted that the same or similar members, etc. will be denoted by the same symbols in the following description, and descriptions of the members, etc. described once will be appropriately left out.

Furthermore, the notation of n$^+$, n, and n$^-$ as well as p$^+$, p, and p$^-$ represents relative levels of the impurity concentrations for each conductivity type in the following description. More specifically, the n$^+$ represents that the n-type impurity concentration is relatively high as compared with the n, whereas the n$^-$ represents that the n-type impurity concentration is relatively low as compared with the n. In addition, the p$^+$ represents that the p-type impurity concentration is relatively high as compared with the p, whereas the p$^-$ represents that the p-type impurity concentration is relatively low as compared with the p. It should be noted that the n$^+$ type or the n$^-$ type may be referred to simply as an n type, whereas the p$^+$ type or the p$^-$ type may be referred to simply as a p type.

First Embodiment

A semiconductor device according to the present embodiment includes: a SiC layer with a surface including a first region that satisfies $N_A-N_D<5\times10^{15}$ cm$^{-3}$ when the concentration of an acceptor is denoted by $N_A$, whereas the concentration of a donor is denoted by $N_D$, where the surface is a surface inclined at 0 degrees or more and 10 degrees or less to a {000-1} face, or a surface with a normal direction inclined at 80 degrees or more and 90 degrees or less to a <000-1> direction; a gate electrode; a gate insulating film provided between the SiC layer and the gate electrode; and a second region provided between the SiC layer and the gate insulating film, with a nitrogen concentration higher than $1\times10^{22}$ cm$^{-3}$.

Figure 1:
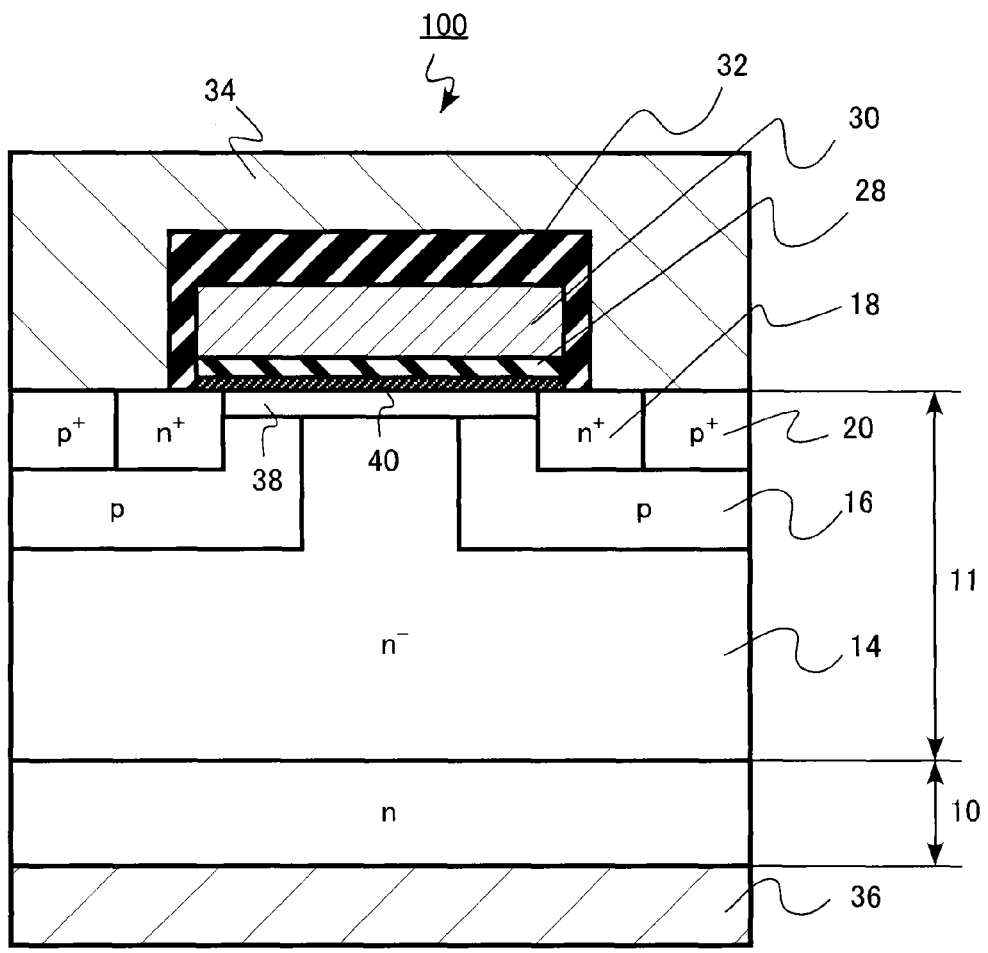
FIG. 1 is a schematic cross-sectional view illustrating a semiconductor device according to a first embodiment.

FIG. 1 is a schematic cross-sectional view illustrating the configuration of a MISFET that is a semiconductor device according to the present embodiment. This MISFET 100 is a Double Implantation Metal Oxide Semiconductor Field Effect Transistor (DIMOSFET) with a base region and a source region formed by ion implantation. The MISFET 100 is an n-type MISFET that uses electrons as carriers.

The MISFET 100 includes an n-type SiC substrate 10 and a SiC layer 11. The SiC layer 11 includes an n⁻-type drift layer 14, a p-type base region 16, an n⁺-type source region 18, a p⁺-type base contact region 20, and a surface region (first region) 38. Furthermore, the MISFET 100 includes an interface region (second region) 40, a gate insulating film 28, a gate electrode 30, an interlayer insulating film 32, a source electrode 34, and a drain electrode 36.

The n-type SiC substrate 10 has first and second surfaces. In FIG. 1, the first surface refers to an upper surface in the figure, whereas the second surface refers to a lower surface in the figure.

The SiC substrate 10 is, for example, a SiC substrate of 4H-SiC containing, for example, N (nitrogen) as an n-type impurity at a concentration of $1 \times 10^{18}$ cm$^{-3}$ or more and $1 \times 10^{20}$ cm$^{-3}$ or less.

Figure 2:
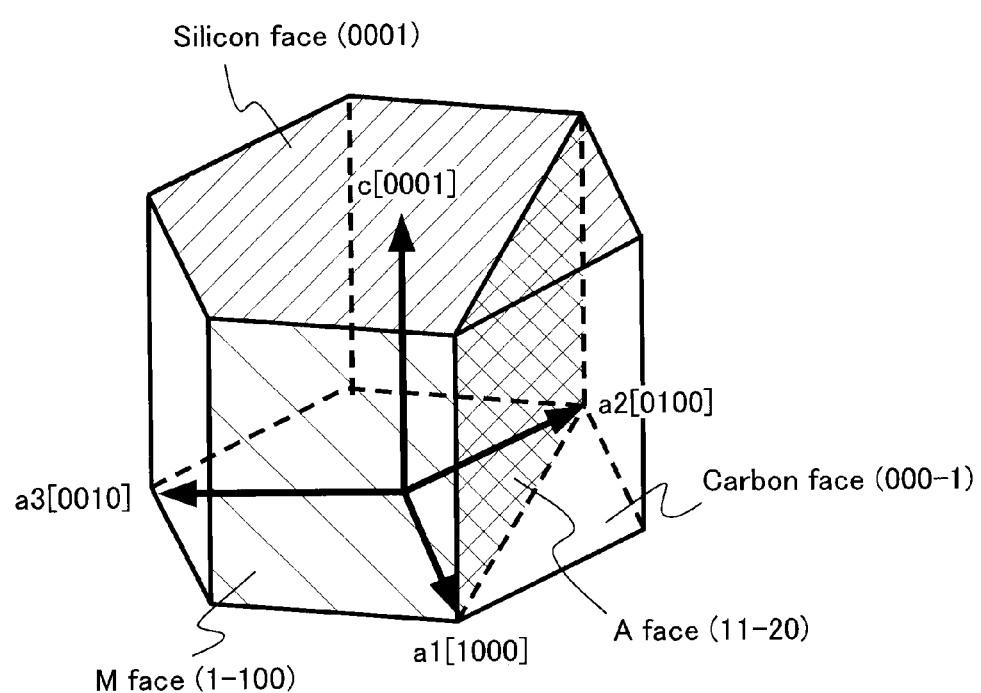
FIG. 2 is a diagram illustrating a crystal structure of a SiC semiconductor according to the first embodiment.

FIG. 2 is a diagram illustrating a crystal structure of a SiC semiconductor. A typical crystal structure of a SiC semiconductor is a hexagonal crystal system such as 4H-SiC. One of faces with a c axis as a normal line in an axis direction of a hexagonal prism (the top faces of the hexagonal prism) is a (0001) face. The face equivalent to the (0001) face is referred to as a silicon face (Si face), and expressed as a {0001} face. The silicon face has an arrangement of Si (silicon).

The other of faces with the c axis as a normal line in the axis direction of a hexagonal prism (the top faces of the hexagonal prism) is a (000-1) face. The face equivalent to the (000-1) face is referred to as a carbon face (C face), and expressed as a {000-1} face. The carbon face has an arrangement of C (carbon).

On the other hand, a side face (prismatic face) of the hexagonal prism is an M face that is a face equivalent to a (1-100) face, that is, a {1-100} face. In addition, a face passing through a pair of ridge lines that are not adjacent to each other is an A face that is a face equivalent to a (11-20) face, that is, a {11-20} face. The M face and the A face have both Si (silicon) and C (carbon) arranged.

Hereinafter, a case where the first surface of the SiC substrate 10 is a surface inclined at 0 degrees or more and 10 degrees or less to the carbon face, whereas the second surface is a surface inclined at 0 degrees or more and 10 degrees or less to the silicon face will be described as an example. The surface inclined at 0 degrees or more and 10 degrees or less to the carbon face, and the surface to inclined at 0 degrees or more and 10 degrees or less the silicon face can be respectively considered nearly equivalent to the carbon face and the silicon face in view of properties.

On the first surface of the SiC substrate 10, the n⁻-type drift layer 14 is formed in which the impurity concentration of an n-type impurity is $5 \times 10^{15}$ cm$^{-3}$ or more and $2 \times 10^{16}$ cm$^{-3}$ or less. The drift layer 14 is, for example, an epitaxial growth layer of SiC formed by epitaxial growth on the SiC substrate 10. The drift layer 14 is, for example, 5 µm or more and 100 µm or less in film thickness.

The drift layer 14 has the p-type base region 16, for example, in which the impurity concentration of a p-type impurity is $1 \times 10^{16}$ cm$^{-3}$ or more and $5 \times 10^{17}$ cm$^{-3}$ or less. The base region 16 has a depth, for example, approximately 0.6 µm.

Partially on the surface of the base region 16, the n⁺-type source region 18 is formed, for example, in which the impurity concentration of an n-type impurity is $1 \times 10^{18}$ cm$^{-3}$ or more and $1 \times 10^{22}$ cm$^{-3}$ or less. The source region 18 has a depth smaller than the depth of the base region 16, for example, approximately 0.3 µm. The n⁺-type source region 18 and the n-type drift layer 14 are provided with the base region 16 interposed therebetween.

Furthermore, next to the source region 18 partially on the surface of the base region 16, the p⁺-type base contact region 20 is formed, for example, in which the impurity concentration of a p-type impurity is $1 \times 10^{18}$ cm$^{-3}$ or more and $1 \times 10^{22}$ cm$^{-3}$ or less. The base contact region 20 has a depth smaller than the depth of the base region 16, for example, approximately 0.3 µm.

The MISFET 100 includes the gate insulating film 28 partially on the surface of the SiC layer 11. It is possible to apply, to the gate insulating film 28, for example, a silicon oxide film, a silicon oxynitride film, or a high-k insulating film.

The high-k insulating film refers to, for example, an aluminum oxide film, an aluminum nitride film, a hafnium oxide film, a hafnium silicate film, or a zirconium silicate film. From the perspective of reducing the leakage current through the gate insulating film 28, it is desirable to apply a silicon oxide film or a silicon nitride film that is large in bandgap as compared with the high-k insulating film.

Partially at the surface of the SiC layer 11, the surface region (first region) 38 is provided. The surface region 38 is provided between the base region 16 and the gate insulating film 28. The surface region 38 satisfies the relationship of $N_A - N_D < 5 \times 10^{15}$ cm$^{-3}$ when the concentration of a p-type impurity (acceptor) is denoted by $N_A$, whereas the concentration of the n-type impurity (donor) is denoted by $N_D$.

The concentration of the p-type impurity and the concentration of the n-type impurity in the surface region 38 are able to be measured by, for example, SIMS (Secondary Ion Mass Spectrometry).

The p-type impurity contained in the surface region 38 is, for example, aluminum (Al). In addition, the n-type impurity contained in the surface region 38 is, for example, nitrogen (N).

The surface region (first region) 38 desirably satisfies the condition of n-type, that is, $N_A - N_D < 0$. In addition, desired is the relationship of $N_A < 5 \times 10^{15}$ cm$^{-3}$, that is, the concentration of the p-type impurity. In addition, the concentration of aluminum in the surface region (first region) 38 is desirably less than $5 \times 10^{15}$ cm$^{-3}$.

The width in depth direction (thickness) of the surface region (first region) 38 of the MISFET 100 is desirably 20 nm or less, more preferably 10 nm or less, from the perspective of preventing the threshold voltage of the MISFET 100 from being decreased.

The gate electrode 30 is formed on the gate insulating film 28. It is possible to apply, for example, doped polysilicon to the gate electrode 30. The interlayer insulating film 32 formed from, for example, a silicon oxide film, is formed on the gate electrode 30.

The surface region 38 or base region 16 under the gate electrode 30 functions as a channel region of the MISFET 100. When the surface region 38 is n-type, the channel region serves as a buried channel.

The interface region (second region) 40 is provided at the interface between the SiC layer 11 and the gate insulating film 28. In the interface region 40, the concentration of nitrogen (N) is higher than $1 \times 10^{22}$ cm$^{-3}$. The concentration of nitrogen is desirably $1.3 \times 10^{22}$ cm$^{-3}$ or more.

The nitrogen concentration in the interface region 40 is able to be measured by, for example, SIMS. In the case of measurement by SIMS, the nitrogen concentration is quantified based on the sensitivity coefficient in SiC by sputtering in a direction from the gate insulating film 28 side to the SiC layer 11.

The nitrogen (N) is segregated at the interface between the SiC layer 11 and the gate insulating film 28. The distance from the gate insulating film 28 to a location where the concentration of nitrogen is $1 \times 10^{19}$ cm$^{-3}$ or less in the interface region (second region) 40 is desirably 10 nm or less, more desirably 5 nm or less.

Figure 3:
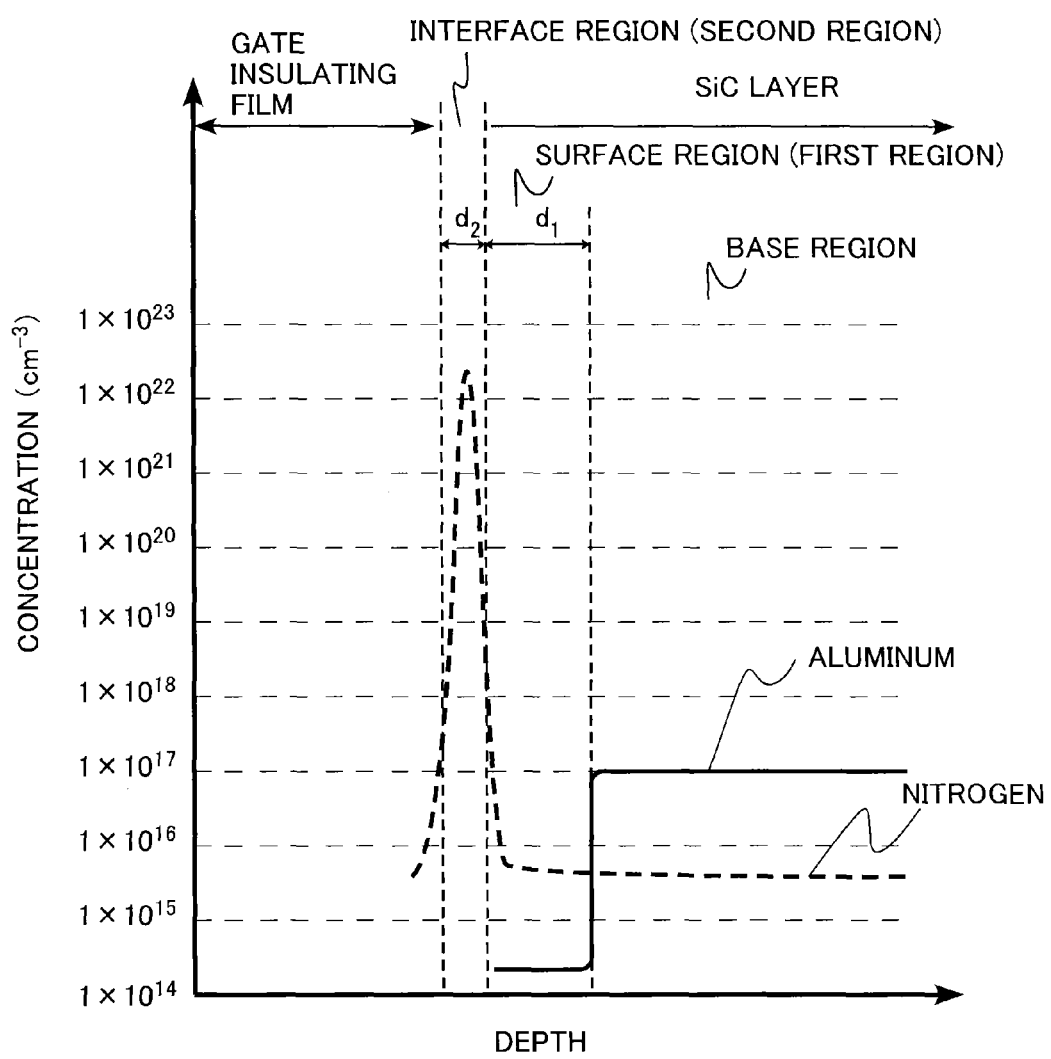
FIG. 3 is a diagram showing an elemental profile on a semiconductor device according to the first embodiment.

FIG. 3 is diagram showing an example of an elemental profile on the semiconductor device according to the present embodiment. The concentration profiles of aluminum and nitrogen is shown on a cross section including the base region 16 and the gate insulating film 28.

As shown in FIG. 3, the concentration of aluminum that is a p-type impurity is less than $5 \times 10^{15}$ cm$^{-3}$ in the surface region (first region) 38. In addition, the nitrogen concentration in the surface region 38 is higher than the aluminum concentration, and the surface region 38 is thus n-type. The width of the surface region 38 is indicated by $d_1$ in FIG. 3.

In addition, as shown in FIG. 3, the nitrogen concentration in the interface region (second region) 40 is higher than $1 \times 10^{22}$ cm$^{-3}$. The nitrogen concentration has a concentration peak in the interface region 40. The distance from the gate insulating film 28 to a location where the concentration of nitrogen is $1 \times 10^{19}$ cm$^{-3}$ or less in the interface region (second region) 40, is indicated by $d_2$ in FIG. 3.

The MISFET 100 includes the conductive source electrode 34 electrically connected to the source region 18 and the base contact region 20. The source electrode 34 also functions as a base electrode that provides an electric potential to the base region 16.

The source electrode 34 is, for example, a metal. The electrode is composed of, for example, a laminate of a nickel (Ni) layer and an aluminum layer. The SiC and the nickel layer may react to form nickel silicide. In addition, the nickel layer and the aluminum layer may react to form an alloy.

Furthermore, the conductive drain electrode 36 is formed on the side of the SiC substrate 10 opposite to the drift layer 14, that is, on the second surface. The drain electrode 36 is, for example, a metal. The electrode is composed of, for example, a laminate of a nickel (Ni) layer and an aluminum layer. The SiC and the nickel layer may react to form nickel silicide. In addition, the nickel layer and the aluminum layer may react to form an alloy.

It should be noted that while the n-type impurity is preferably, for example, N (nitrogen) or P (phosphorus) in the present embodiment, it is also possible to apply As (arsenic) or Sb (antimony), or the like. Further, while the p-type impurity is preferably, for example, Al (aluminum), it is also possible to apply B (boron), Ga (gallium), In (indium), or the like.

Next, a method for manufacturing a semiconductor device according to the present embodiment will be described. The method for manufacturing a semiconductor device according to the present embodiment is an example of a method for manufacturing the semiconductor device shown in FIG. 1. FIGS. 4 through 10 are schematic cross-sectional views illustrating semiconductor devices in the in the middle of manufacture in the method for manufacturing the semiconductor device according to the present embodiment.

First, the n-type SiC substrate 10 is prepared which has the first surface of a carbon face and the second surface of a silicon face.

Figure 4:
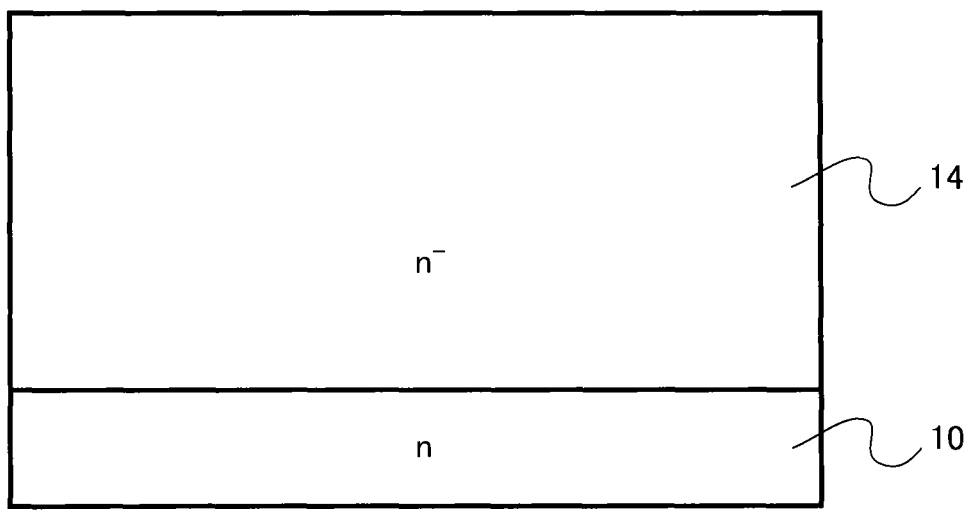
FIG. 4 is a schematic cross-sectional view illustrating a semiconductor device in the middle of manufacture in a method for manufacturing the semiconductor device according to the first embodiment.

Next, the n$^-$-type drift layer 14 is formed by an epitaxial growth method on the first surface of the SiC substrate 10 (FIG. 4).

Figure 5:
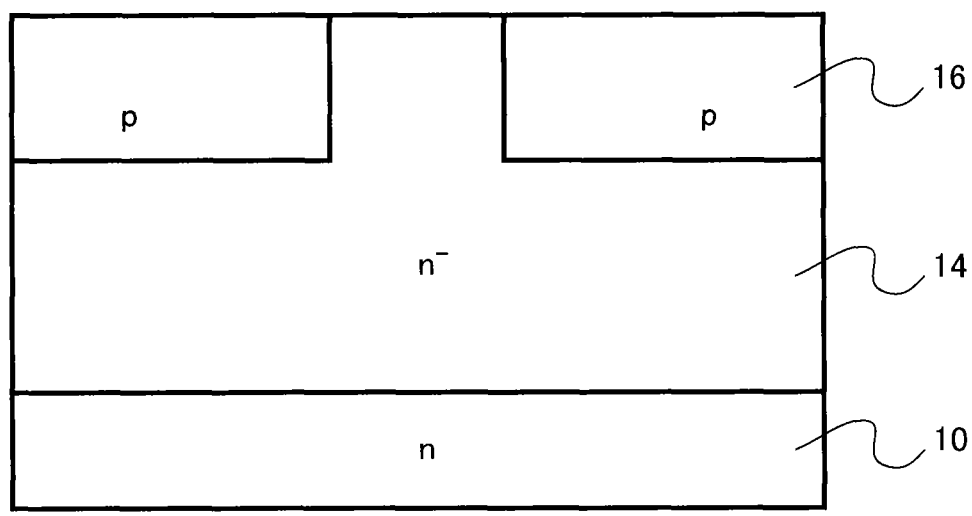
FIG. 5 is a schematic cross-sectional view illustrating a semiconductor device in the middle of manufacture in the method for manufacturing the semiconductor device according to the first embodiment.

Next, the drift layer 14 is subjected to ion implantation with aluminum that is a p-type impurity to form the base region 16 (FIG. 5).

Figure 6:
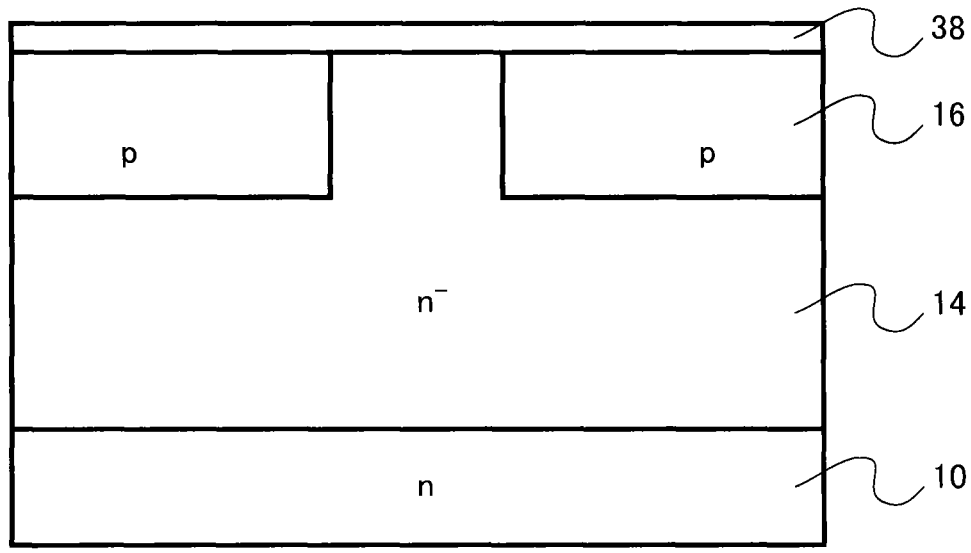
FIG. 6 is a schematic cross-sectional view illustrating a semiconductor device in the middle of manufacture in the method for manufacturing the semiconductor device according to the first embodiment.

Next, the surface region 38 is formed by an epitaxial growth method on the drift layer 14 and the base region 16 (FIG. 6)

Figure 7:
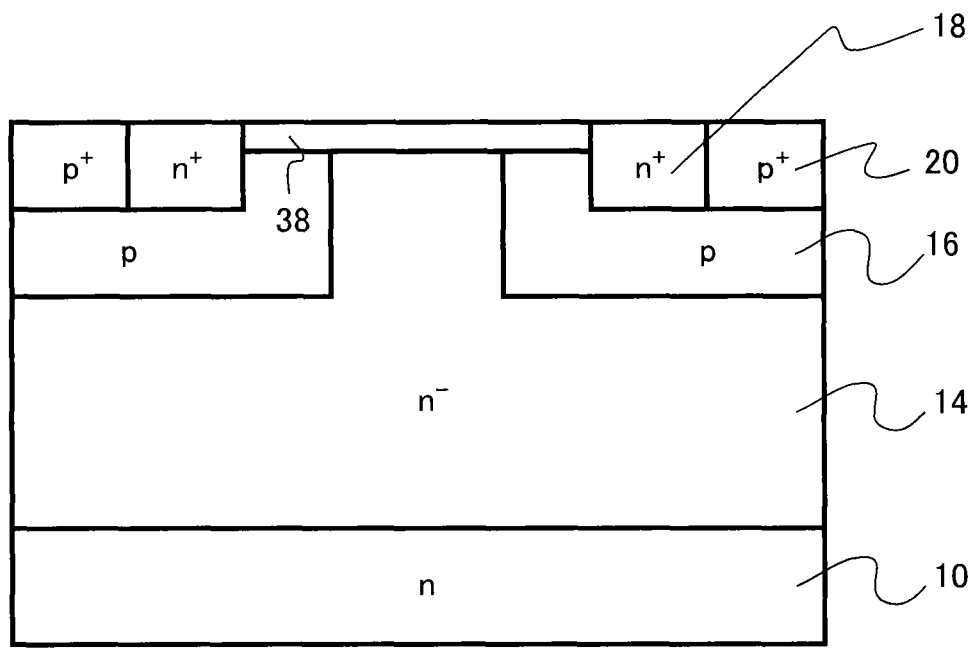
FIG. 7 is a schematic cross-sectional view illustrating a semiconductor device in the middle of manufacture in the method for manufacturing the semiconductor device according to the first embodiment.

Next, the surface region 38 and the base region 16 are subjected to ion implantation with nitrogen that is an n-type impurity to form the source region 18. Next, the surface region 38 and the base region 16 are subjected to ion implantation with aluminum that is a p-type impurity to form the base contact region 20 (FIG. 7).

Figure 8:
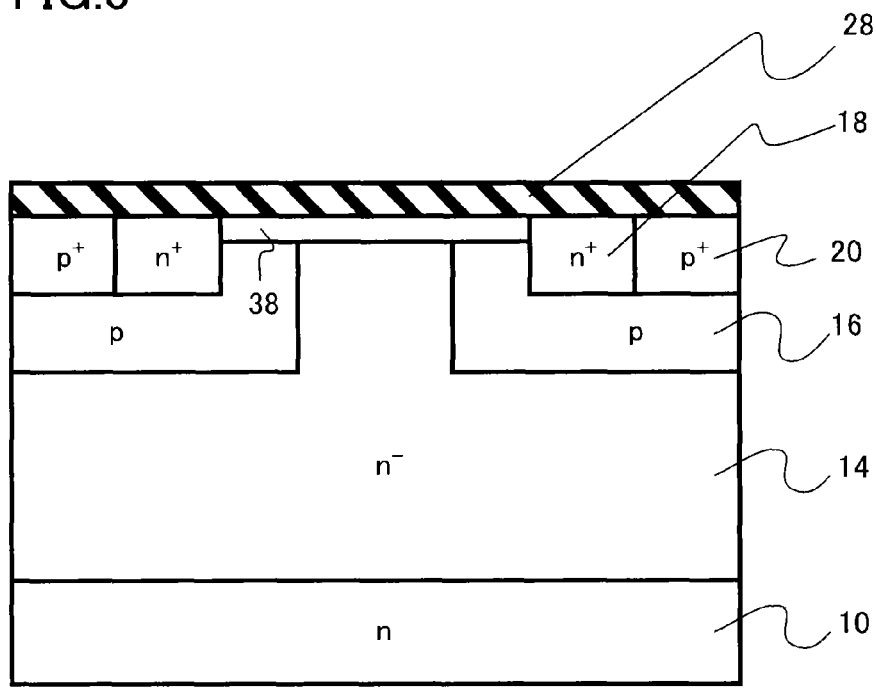
FIG. 8 is a schematic cross-sectional view illustrating a semiconductor device in the middle of manufacture in the method for manufacturing the semiconductor device according to the first embodiment.

Next, the gate insulating film 28 is formed on the surface region 38, the source region 18, and the base contact region 20 (FIG. 8). The gate insulating film 28 is, for example, a silicon oxide film formed by a CVD (Chemical Vapor Deposition) method. The gate insulating film 28 is also able to be formed by thermal oxidation.

Figure 9:
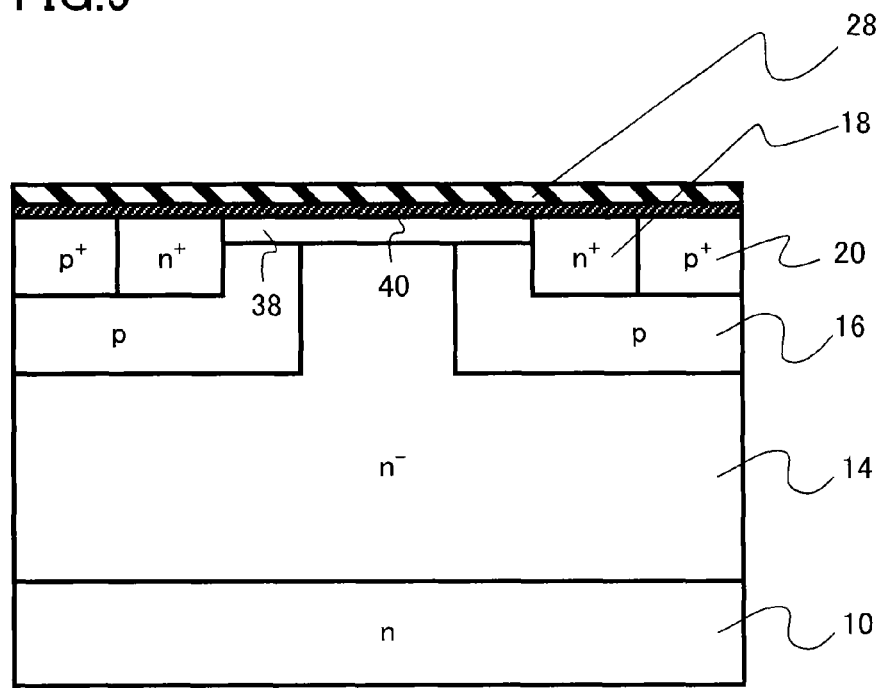
FIG. 9 is a schematic cross-sectional view illustrating a semiconductor device in the middle of manufacture in the method for manufacturing the semiconductor device according to the first embodiment.

Next, the interface region 40 is formed between the surface region 38 and the gate insulating film 28 (FIG. 9). The interface region 40 is formed by, for example, heat treatment in a nitrogen atmosphere. The interface region 40 is also able to be formed before the formation of the gate insulating film 28.

Figure 10:
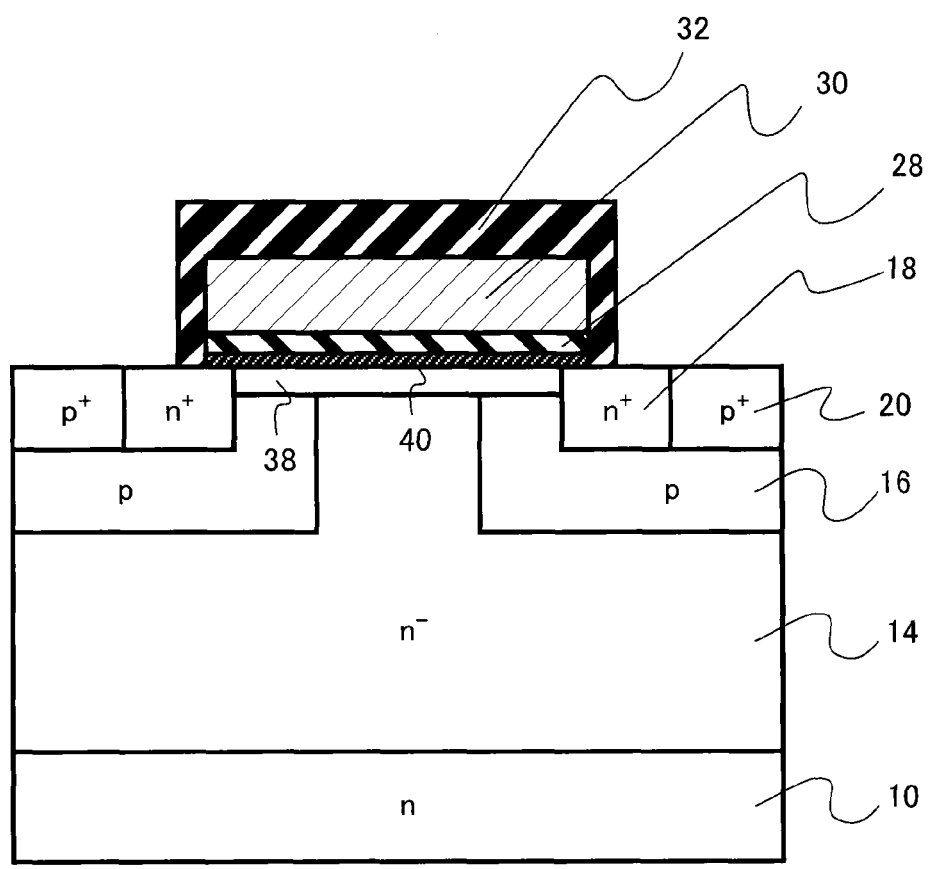
FIG. 10 is a schematic cross-sectional view illustrating a semiconductor device in the middle of manufacture in the method for manufacturing the semiconductor device according to the first embodiment.

Next, the gate electrode 30 of, for example, polysilicon is formed on the gate insulating film 28. Next, the interlayer insulating film 32 of, for example, a silicon oxide film is formed on the gate electrode 30 (FIG. 10)

Next, the conductive source electrode 34 is formed which is electrically connected to the source region 18 and the base contact region 20. The source electrode 34 is formed by sputtering nickel and aluminum, for example.

Next, the conductive drain electrode 36 is formed on the second surface of the SiC substrate 10. The drain electrode 36 is formed by sputtering nickel and aluminum, for example.

The MISFET 100 shown in FIG. 1 is formed by the manufacturing method described above.

It should be noted that while a case of forming the surface region 38 by epitaxial growth has been described as an example, for example, the surface of the base region 16 is also able to be subjected to ion implantation with an n-type impurity for the formation. Alternatively, the ion implantation profile for the formation of the base region 16 is also able to be controlled for the formation.

Hereinafter, functions and effects of the semiconductor device according to the present embodiment will be described. FIGS. 11A to 13B are explanatory diagrams for functions and effects of the semiconductor device according to the present embodiment.

When a MISFET is formed on SiC, the C face channel can achieve a higher mobility as compared with a case of the Si face channel. Therefore, the C face channel can achieve a MISFET that is low in ON resistance.

On the other hand, the C face channel has the problem of increasing the leakage current through a gate insulating film during ON operation, as compared with a case of the Si face channel. The substantial decrease in potential barrier between the SiC layer and the gate insulating film is considered as a cause at the C face with an arrangement of carbon at the surface.

Figure 11A:
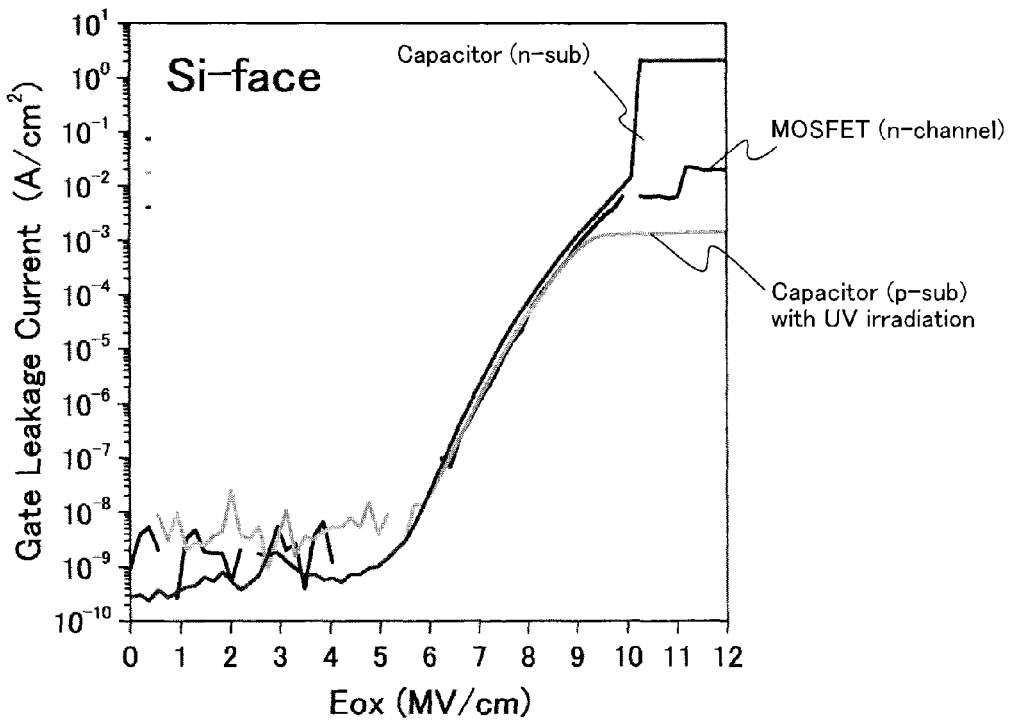
FIGS. 11A and 11B are explanatory diagrams for functions and effects according to the first embodiment.
Figure 11B:
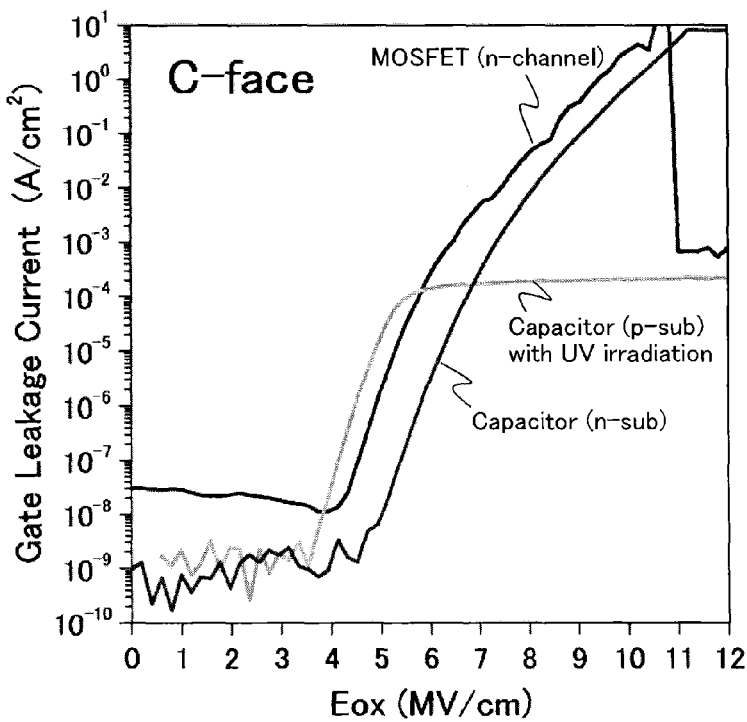

FIGS. 11A and 11B are diagrams showing evaluation results for the leakage current through a gate insulating film of a MOS structure. FIG. 11A is a case of a MOS case formed on a Si face, whereas FIG. 11B is a case of a MOS structure formed on a C face. The horizontal axis indicates an electric field applied to the gate insulating film, whereas the vertical axis indicates a leakage current value through the gate insulating film.

Each of the figures corresponds to evaluation results for: (1) an n-type MOSFET formed on a p-type SiC substrate; (2) a MOS capacitor formed on an n-type SiC substrate; and (3) a MOS capacitor formed on a p-type SiC substrate.

The p-type SiC substrate contains aluminum that is a p-type impurity at $5 \times 10^{15}$ cm$^{-3}$. The n-type SiC substrate contains nitrogen that is an n-type impurity at $5 \times 10^{15}$ cm$^{-3}$.

In the case of measurement for the samples (1) to (3), a voltage is applied so that a gate electrode has a relatively positive electric potential with respect to the substrate in each case. In the n-type MISFET formed on the C face, the gate insulating film and the gate electrode are typically on the p-type SiC. In the case of measurement for the sample (1), the electron accumulation at the surface of the p-type SiC substrate forms an inversion layer. In addition, in the case of the sample (3), the p-type SiC substrate is irradiated with ultraviolet (UV) rays to accumulate electrons at the substrate surface for the measurement.

As is clear from FIG. 11A, results independent of the structures of the samples and the evaluation methods have been obtained in the case of the Si face. On the other hand, as is clear from FIG. 11B, in the case of the sample (2), that is, the MOS capacitor formed on the n-type SiC substrate, a reduction in leakage current has been confirmed. In other words, there has been a tendency to increase the leakage current in the case of the p-type SiC substrate.

From these results, it has become clear that the leakage current is reduced by making the SiC substrate n-type, or making the concentration of aluminum in the SiC substrate, which is a p-type impurity in the substrate, less than $5 \times 10^{15}$ cm$^{-3}$.

Figure 12:
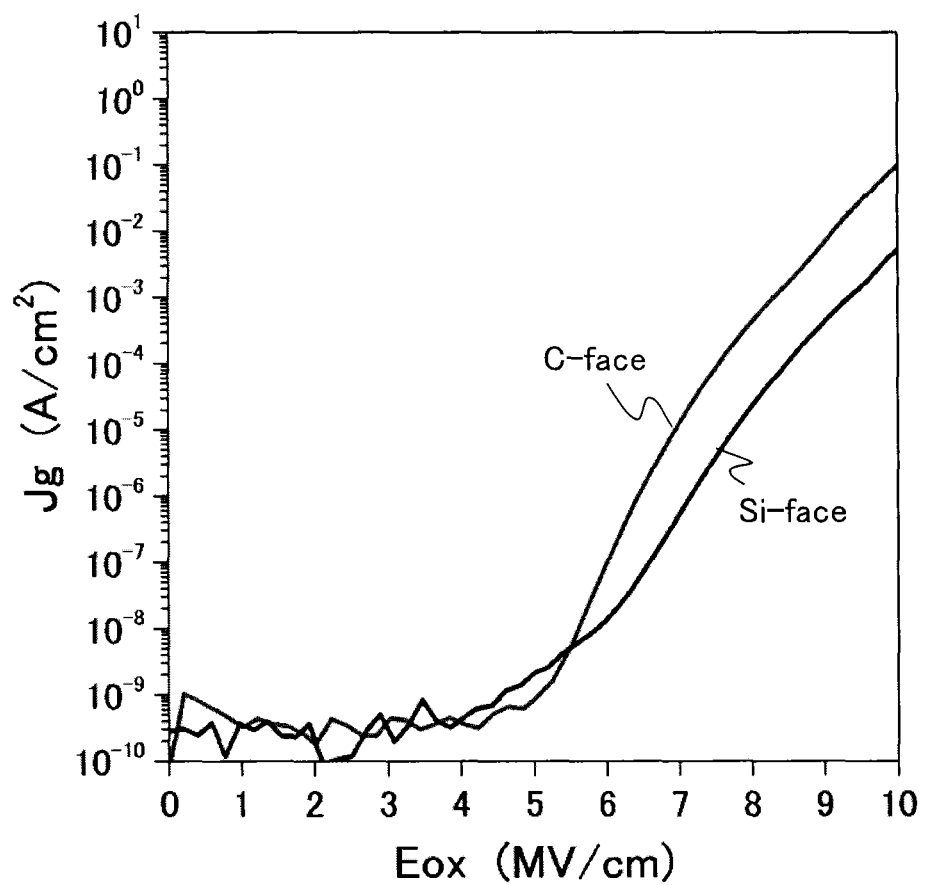
FIG. 12 is an explanatory diagram for functions and effects according to the first embodiment.

FIG. 12 is a diagram showing a comparison result between the C face and the Si face for the leakage current through the gate insulating film of the MOS structure. The horizontal axis indicates an electric field applied to the gate insulating film, whereas the vertical axis indicates a leakage current value through the gate insulating film.

There is an evaluation result for the MOS capacitor formed on the n-type SiC substrate. The n-type SiC substrate contains nitrogen that is an n-type impurity at $5 \times 10^{15}$ cm$^{-3}$.

As is clear from FIG. 12, even when a comparison is made for the n-type SiC substrate, the leakage current is increased in the case of the C face as compared with the Si face.

Figure 13A:
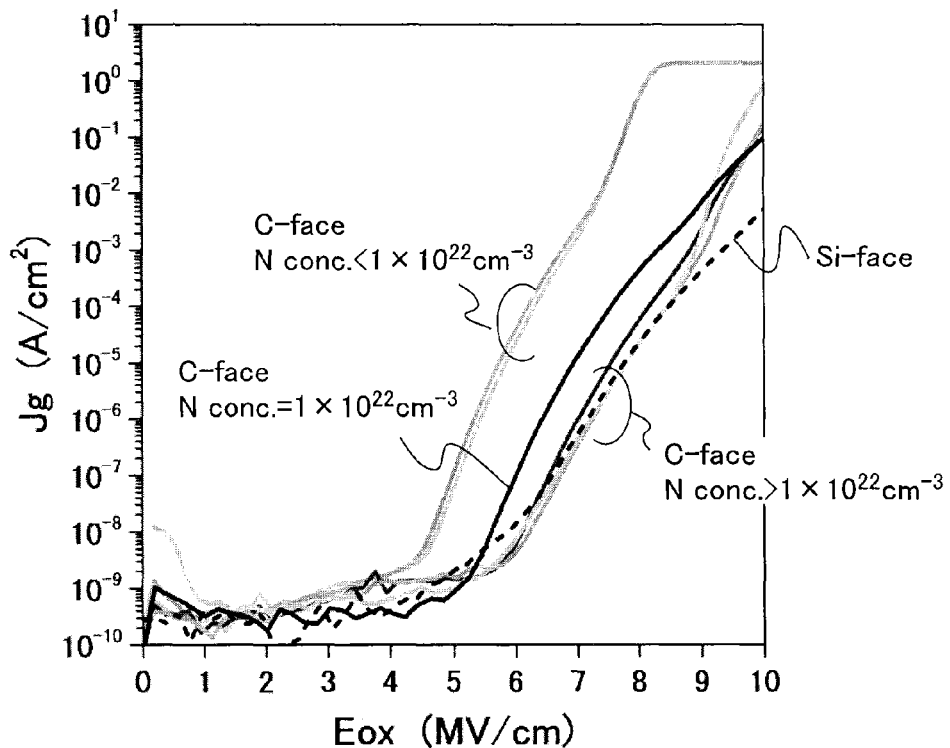
FIGS. 13A and 13B are explanatory diagrams for functions and effects according to the first embodiment.
Figure 13B:
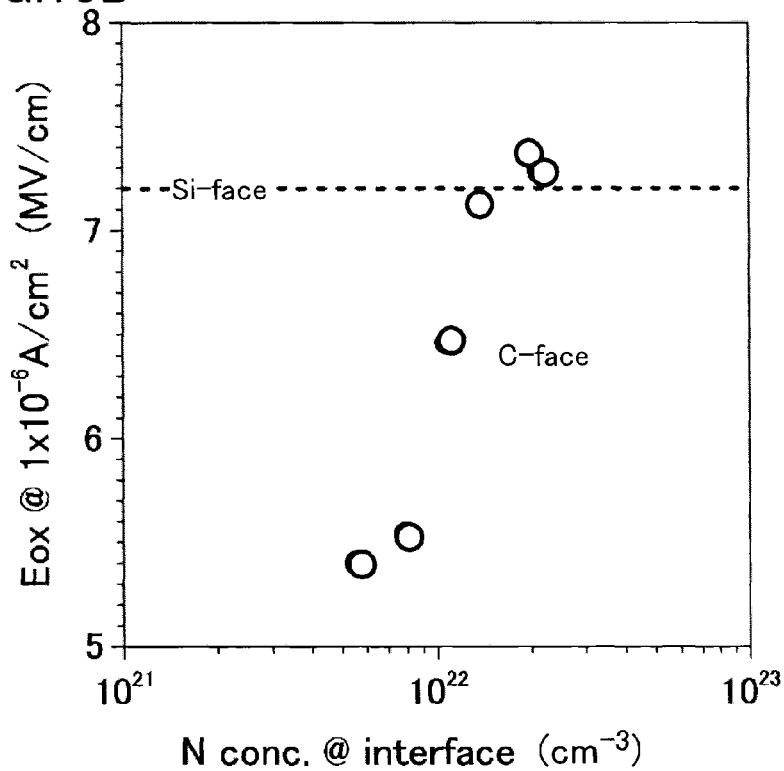

FIGS. 13A and 13B are diagrams showing the interfacial nitrogen concentration dependence of the leakage current through a gate insulating film of a MOS structure on the C face. There are evaluation results for MOS capacitors formed on n-type SiC substrates.

Samples were prepared in a way that an interface region containing nitrogen was formed between the substrate and the gate insulating film, and varied in nitrogen concentration. The interface region was formed by heat treatment in a nitrogen atmosphere. The n-type SiC substrate contains nitrogen that is an n-type impurity at $5 \times 10^{15}$ cm$^{-3}$.

FIG. 13A represents electric field-current characteristics. The horizontal axis indicates an electric field applied to the gate insulating film, whereas the vertical axis indicates a leakage current value through the gate insulating film. Characteristics on the Si surface are also shown by way of comparison.

FIG. 13B represents the interfacial nitrogen concentration dependence of the leakage current through the gate insulating film. The horizontal axis indicates a nitrogen concentration in the interface region, whereas the vertical axis indicates an electric field applied for a current density of $1 \times 10^{-6}$ A/cm$^2$. The electric field applied for a current density of $1 \times 10^{-6}$ A/cm$^2$ in the case of the Si face is indicated by a dashed line.

As is clear from FIGS. 13A and 13B, the leakage current is peaked at a nitrogen concentration of $1 \times 10^{22}$ cm$^{-3}$ in the interface region, and decreased sharply. At concentrations higher than $1 \times 10^{22}$ cm$^{-3}$, the leakage current can be reduced to be equivalent to that in the case of the Si face. From the perspective of reducing the leakage current, the nitrogen concentration is desirably $1.3 \times 10^{22}$ cm$^{-3}$ or more, more desirably $2 \times 10^{22}$ cm$^{-3}$ or more.

In the present embodiment, at the surface of the SiC layer 11 immediately below the gate insulating film 28 of the n-type MISFET, the surface region (first region) 38 with $N_A - N_D < 5 \times 10^{15}$ cm$^{-3}$ is provided when the concentration of the p-type impurity is denoted by $N_A$, whereas the concentration of the n-type impurity is denoted by $N_D$. Therefore, the surface of the SiC layer 11 immediately below the gate insulating film 28 serves as a low-concentration p-type region with a p-type impurity concentration less than $5 \times 10^{15}$ cm$^{-3}$, or the surface of the SiC layer 11 immediately below the gate insulating film 28 serves as an n-type region. Thus, it becomes possible to reduce the leakage current through the gate insulating film of the MISFET formed on the C face.

Furthermore, providing the interface region (second region) 40 containing a higher concentration of nitrogen than $1 \times 10^{22}$ cm$^{-3}$ between the SiC layer 11 and the gate insulating film 28 makes it possible to further reduce the leakage current through the gate insulating film.

Providing the surface region 38 with $N_A - N_D < 5 \times 10^{15}$ cm$^{-3}$ and the interface region 40 containing a higher concentration of nitrogen than $1 \times 10^{22}$ cm$^{-3}$ is considered to be able to suppress the decrease in potential barrier between the SiC layer and the gate insulating film at the C face with an arrangement of carbon at the surface.

It should be noted that from the perspective of reducing the leakage current through the gate insulating film, the surface region (first region) 38 is desirably n-type, and the surface region (first region) 38 desirably satisfies $N_A < 5 \times 10^{15}$ cm$^{-3}$. Furthermore, the concentration of aluminum in the surface region (first region) 38 is desirably less than $5 \times 10^{15}$ cm$^{-3}$.

In addition, when the p-type surface region (first region) 38 is excessively thick which has a low n-type or p-type impurity concentration, there is a possibility that the threshold voltage of the MISFET 100 will be excessively decreased. Therefore, the width of the surface region (first region) 38 of the MISFET 100 is desirably 20 nm or less, more preferably 10 nm or less, from the perspective of preventing the threshold voltage of the MISFET 100 from being decreased.

In addition, when the n-type impurity concentration is excessively high in the surface region (first region) 38, there is a possibility that the threshold voltage of the MISFET 100 will be excessively decreased. Therefore, the n-type impurity concentration in the surface region 38 is desirably $1 \times 10^{16}$ cm$^{-3}$ or less, more desirably $5 \times 10^{15}$ cm$^{-3}$ or less.

According to the present embodiment, the MISFET 100 can be achieved which is low in ON resistance, and small in leakage current through the gate insulating film.

Second Embodiment

The semiconductor device according to the present embodiment is the same as in the first embodiment, except that the surface of the SiC layer is a surface with a normal line inclined at 80 degrees or more and 90 degrees or less to the <000-1> direction. Therefore, the contents overlapping with the first embodiment will not be repeated.

The configuration of the MISFET according to the present embodiment is the same as the configuration shown in FIG. 1, except for the plane directions of the first surface of the SiC substrate 10 and of the surface of the SiC layer 11. Hereinafter, the MISFET according to the present embodiment will be described with reference to FIG. 1.

In the MISFET according to the present embodiment, the first surface of the SiC substrate 10 and the surface of the SiC layer 11 are surfaces with normal directions inclined at 80 degrees or more and 90 degrees or less to the <000-1> direction. Even in the case of adopting, as channels, the first surface of the SiC substrate 10 and the surface of the SiC layer 11 with normal directions inclined at 80 degrees or more and 90 degrees or less to the <000-1> direction, a relatively high mobility is achieved as compared with the Si face.

The surfaces with normal directions inclined at 80 degrees or more and 90 degrees or less to the <000-1> direction have both carbon (C) and silicon (Si) exposed at the surfaces. Therefore, the leakage current through the gate insulating film 28 is reduced as in the first embodiment.

The surface of the SiC layer 11 is more desirably a surface inclined at 0 degrees or more and 10 degrees or less to the industrially high use {1-100} face (M face) or {11-20} face (A face), from the perspective of reduction in manufacturing cost.

According to the present embodiment, the MISFET can be achieved which is low in ON resistance, and small in leakage current through the gate insulating film as in the first embodiment.

Third Embodiment

The semiconductor device according to the present embodiment is the same as in the first embodiment, except that the device is a trench-gate MISFET. Therefore, the contents overlapping with the first embodiment will not be repeated.

Figure 14:
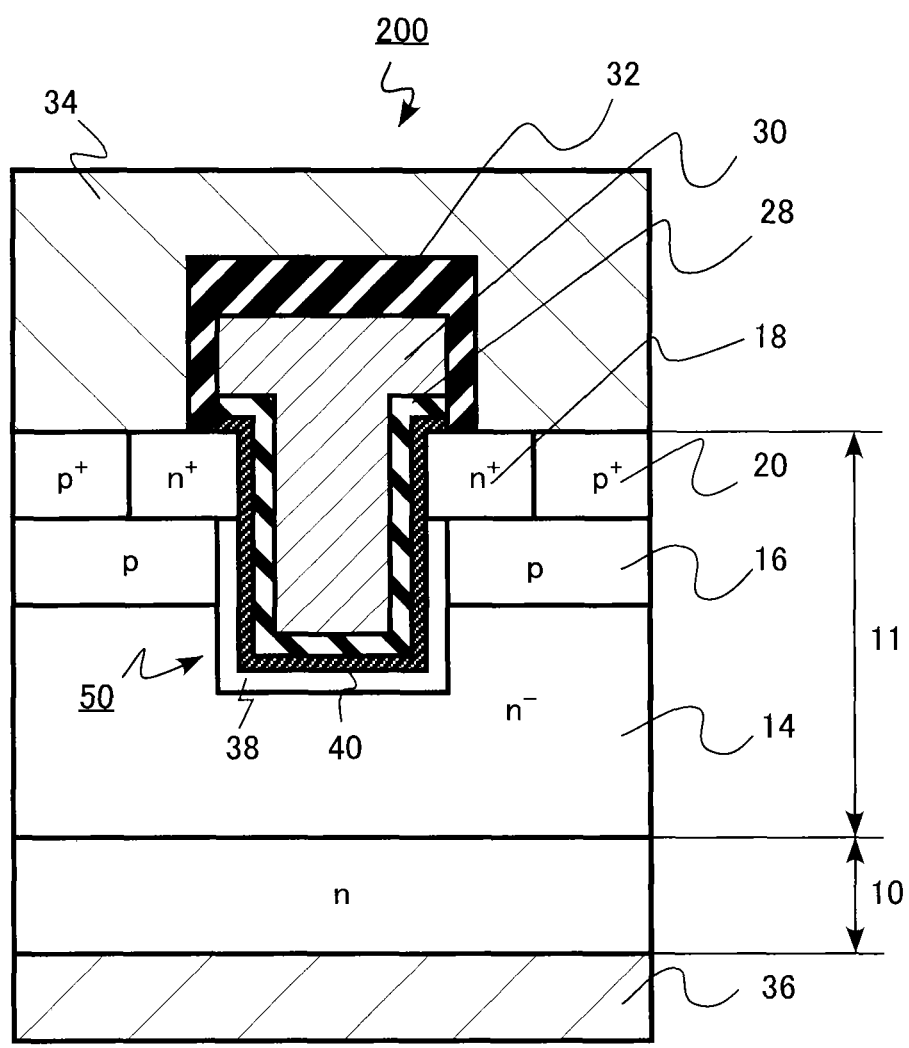
FIG. 14 is a schematic cross-sectional view illustrating a semiconductor device according to a third embodiment.

FIG. 14 is a schematic cross-sectional view illustrating the configuration of a MISFET that is a semiconductor device according to the present embodiment. This MISFET 200 is a trench-gate MISFET with a gate insulating film ad a gate electrode provided in a trench.

The MISFET 200 includes an n-type SiC substrate 10 and a SiC layer 11. The SiC layer 11 includes an n⁻-type drift layer 14, a p-type base region 16, an n⁺-type source region 18, a p⁺-type base contact region 20, and a surface region (first region) 38. Furthermore, the MISFET 200 includes a trench 50, an interface region (second region) 40, a gate insulating film 28, a gate electrode 30, an interlayer insulating film 32, a source electrode 34, and a drain electrode 36.

This MISFET 200 includes the n-type SiC substrate 10 with first and second surfaces. In FIG. 14, the first surface refers to an upper surface in the figure, whereas the second surface refers to a lower surface in the figure.

This SiC substrate 10 is, for example, a SiC substrate of 4H-SiC containing, for example, N (nitrogen) as an n-type impurity at a concentration of $1 \times 10^{18}$ cm$^{-3}$ or more and $1 \times 10^{20}$ cm$^{-3}$ or less. In addition, the first surface of the SiC substrate 10 is a surface inclined at 0 degrees or more and 10 degrees or less to the carbon face, whereas the second surface is a surface inclined at 0 degrees or more and 10 degrees or less to the silicon face.

On the first surface of the SiC substrate 10, the n⁻-type drift layer 14 is formed in which the impurity concentration of an n-type impurity is $5 \times 10^{15}$ cm$^{-3}$ or more and $2 \times 10^{16}$ cm$^{-3}$ or less. The drift layer 14 is, for example, an epitaxial growth layer of SiC formed by epitaxial growth on the SiC substrate 10.

The drift layer 14 has the base region 16, for example, in which the impurity concentration of a p-type impurity is $1 \times 10^{16}$ cm$^{-3}$ or more and $5 \times 10^{17}$ cm$^{-3}$ or less. The base region 16 has a depth, for example, approximately 0.6 μm.

Partially on the surface of the base region 16, the n⁺-type source region 18 is formed, for example, in which the impurity concentration of an n-type impurity is $1 \times 10^{18}$ cm$^{-3}$ or more and $1 \times 10^{22}$ cm$^{-3}$ or less. The source region 18 has a depth smaller than the depth of the base region 16, for example, approximately 0.3 μm.

Furthermore, next to the source region 18 partially on the surface of the base region 16, the p⁺-type base contact region 20 is formed, for example, in which the impurity concentration of a p-type impurity is $1 \times 10^{18}$ cm$^{-3}$ or more and $1 \times 10^{22}$ cm$^{-3}$ or less. The base contact region 20 has a depth smaller than the depth of the base region 16, for example, approximately 0.3 μm.

The trench 50 is provided in a direction from the surface of the SiC layer 11 toward the SiC substrate 10. The inner wall surface of the trench 50 is, for example, the M face or the A face.

The MISFET 200 includes the gate insulating film 28 partially on the surface of the SiC layer 11 and on the inner wall surface of the trench 50. It is possible to apply, to the gate insulating film 28, for example, a silicon oxide film, a silicon oxynitride film, or a high-k insulating film. From the perspective of reducing the leakage current through the gate insulating film 28, it is desirable to apply a silicon oxide film or a silicon nitride film that is large in bandgap as compared with the high-k insulating film.

Partially at the SiC layer 11 on the inner wall surface of the trench 50, the surface region (first region) 38 is provided. The surface region 38 is provided between the base region 16 and the gate insulating film 28. The surface region 38 satisfies the relationship of $N_A - N_D < 5 \times 10^{15}$ cm$^{-3}$ when the concentration of a p-type impurity (acceptor) is denoted by $N_A$, whereas the concentration of the n-type impurity (donor) is denoted by $N_D$.

Further, the gate electrode 30 is formed on the gate insulating film 28. The surface region 38 or base region 16 on an inner side surface of the trench 50 functions as a channel region of the MISFET 200.

The interface region (second region) 40 is provided at the interface between the SiC layer 11 on the inner side surface of the trench 50 and the gate insulating film 28. The interface region 40 contains a higher concentration of nitrogen (N) than $1 \times 10^{22}$ cm$^{-3}$.

According to the present embodiment, the MISFET 200 can be achieved which is low in ON resistance, and small in leakage current through the gate insulating film 28 as in the first embodiment. Furthermore, the adoption of the trench-gate structure makes it possible to improve the integration degree of the MISFET 200, and the elimination of the JFET makes it possible to reduce the conduction loss.

Fourth Embodiment

The semiconductor device according to the present embodiment is the same as in the first embodiment, except that the device is not an MISFET, but an IGBT (Insulated Gate Bipolar Transistor). Therefore, the contents overlapping with the first embodiment will not be repeated.

Figure 15:
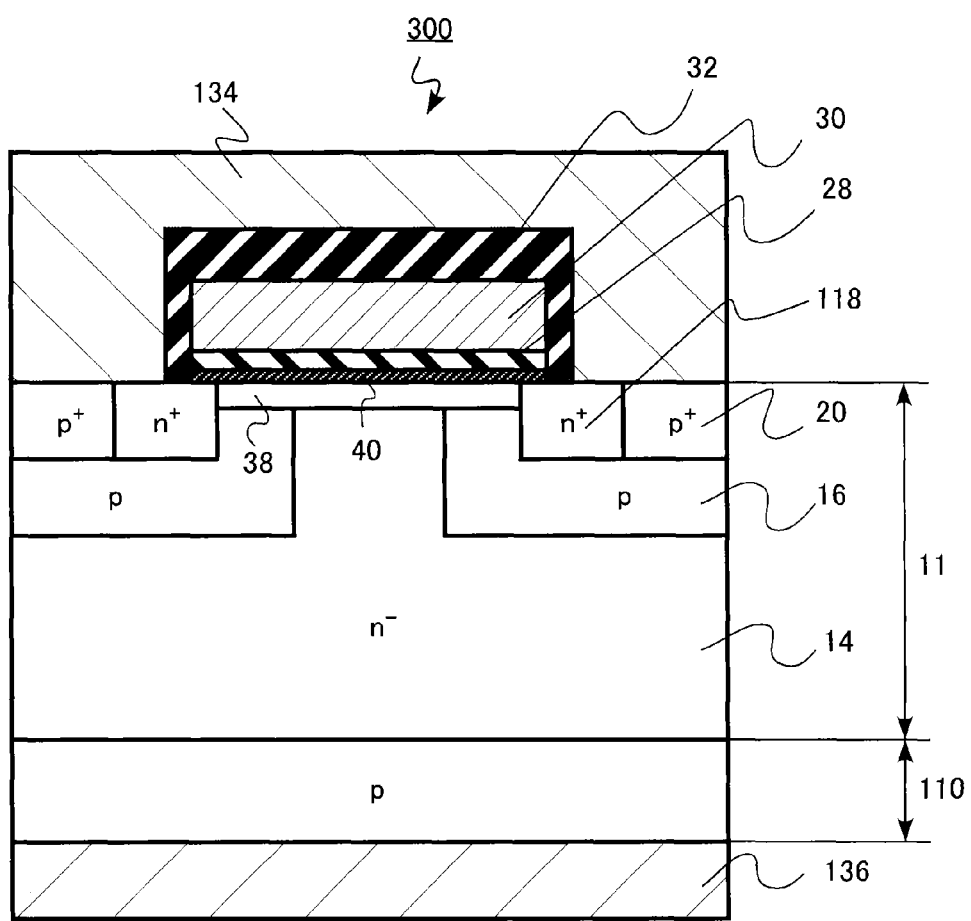
FIG. 15 is a schematic cross-sectional view illustrating a semiconductor device according to a fourth embodiment.

FIG. 15 is a schematic cross-sectional view illustrating the configuration of an IGBT that is a semiconductor device according to the present embodiment.

The IGBT 300 includes a p-type SiC substrate 110 and a SiC layer 11. The SiC layer 11 includes an n⁻-type drift layer 14, a p-type base region 16, an n⁺-type emitter region 118, a p⁺-type base contact region 20, and a surface region (first region) 38. Furthermore, the IGBT 300 includes an interface region (second region) 40, a gate insulating film 28, a gate electrode 30, an interlayer insulating film 32, an emitter electrode 134, and a collector electrode 136.

This IGBT 300 includes the p-type SiC substrate 110 having first and second surfaces. In FIG. 15, the first surface refers to an upper surface in the figure, whereas the second surface refers to a lower surface in the figure.

This SiC substrate 110 is, for example, a SiC substrate of 4H-SiC containing, for example, aluminum (Al) as a p-type impurity at a concentration of $1 \times 10^{18}$ cm$^{-3}$ or more and $1 \times 10^{20}$ cm$^{-3}$ or less. In addition, the first surface of the SiC substrate 110 is a surface inclined at 0 degrees or more and 10 degrees or less to the carbon face, whereas the second surface is a surface inclined at 0 degrees or more and 10 degrees or less to the silicon face.

On the first surface of the SiC substrate 110, the n⁻-type drift layer 14 is formed in which the impurity concentration of an n-type impurity is $5 \times 10^{15}$ cm$^{-3}$ or more and $2 \times 10^{16}$ cm$^{-3}$ or less. The drift layer 14 is, for example, an epitaxial growth layer of SiC formed by epitaxial growth on the SiC substrate 112.

According to the present embodiment, the IGBT 300 can be achieved which is low in ON resistance, and small in leakage current through the gate insulating film 28, due to the same function as in the first embodiment.

Fifth Embodiment

The semiconductor device according to the present embodiment is the same as in the first embodiment, except that the device is not an MISFET, but a MIS capacitor. Therefore, the contents overlapping with the first embodiment will not be repeated.

Figure 16:
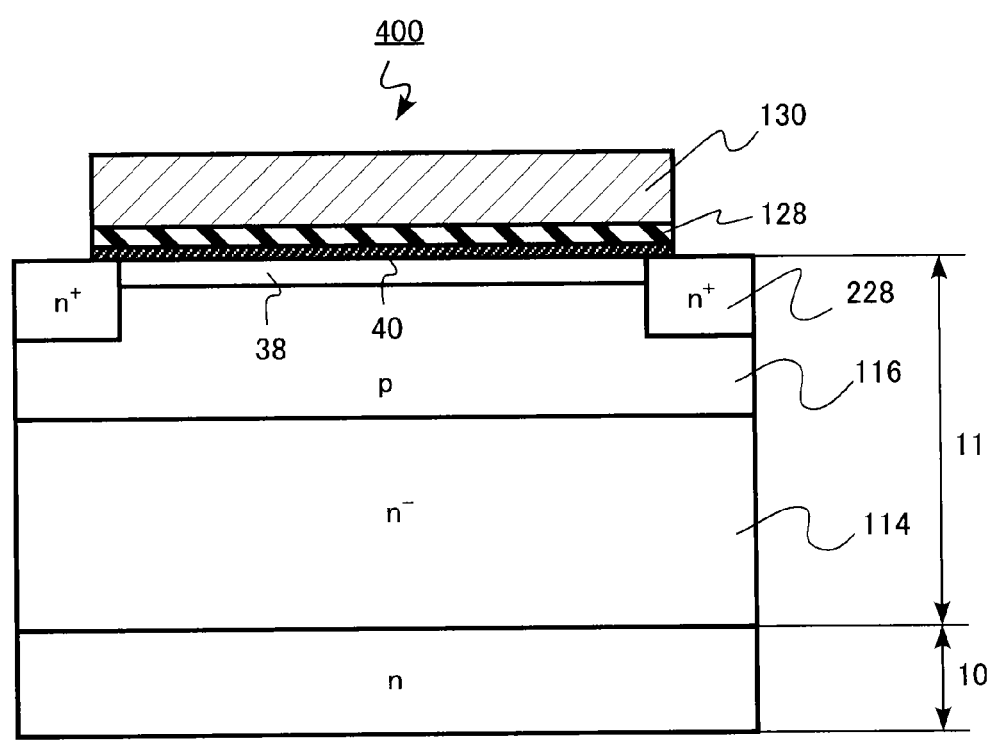
FIG. 16 is a schematic cross-sectional view illustrating a semiconductor device according to a fifth embodiment.

FIG. 16 is a schematic cross-sectional view illustrating the configuration of an MIS capacitor that is a semiconductor device according to the present embodiment. The MIS capacitor 400 is, for example, a smoothing capacitor consolidated on the same substrate as the MISFET 100 according to the first embodiment.

The MIS capacitor 400 includes an n-type SiC substrate 10 and a SiC layer 11. The SiC layer 11 includes an n⁻-type SiC layer 114, a p-type SiC layer 116, an n⁺-type SiC region 228, and a surface region (first region) 38. Furthermore, the MIS capacitor 400 includes an interface region (second region) 40, a gate insulating film (capacitor insulating film) 28, and a gate electrode (upper electrode) 30.

This MIS capacitor 400 includes the n-type SiC substrate 10 with first and second surfaces. In FIG. 16, the first surface refers to an upper surface in the figure, whereas the second surface refers to a lower surface in the figure.

This SiC substrate 10 is, for example, a SiC substrate of 4H-SiC containing, for example, N (nitrogen) as an n-type impurity at a concentration of $1 \times 10^{18}$ cm$^{-3}$ or more and $1 \times 10^{20}$ cm$^{-3}$ or less. In addition, the first surface of the SiC substrate 10 is a surface inclined at 0 degrees or more and 10 degrees or less to the carbon face, whereas the second surface is a surface inclined at 0 degrees or more and 10 degrees or less to the silicon face.

On the first surface of the SiC substrate 10, the n⁻-type SiC layer 114 is formed in which the impurity concentration of an n-type impurity is $5 \times 10^{15}$ cm$^{-3}$ or more and $2 \times 10^{16}$ cm$^{-3}$ or less. The n⁻-type SiC layer 114 is, for example, an epitaxial growth layer of SiC formed by epitaxial growth on the SiC substrate 10.

In the MIS capacitor 400, the gate electrode 30 serves as an upper electrode, whereas the n⁺-type SiC region 228 serves as a lower electrode.

According to the present embodiment, the MIS capacitor 400 can be achieved which is mall in leakage current through the gate insulating film (capacitor insulating film) 28, due to the same function as in the first embodiment.

While cases of 4H-SiC as a crystal structure of SiC (silicon carbide) have been described above as examples in the embodiments, the present disclosure is also able to be applied to SiC of other crystal structure such as 6H-SiC and 3C-SiC.

Furthermore, while the n-type MISFET, the n-type IGBT, and the MIS capacitor have been described as examples of the semiconductor device in the embodiments, the present disclosure is also able to be applied other semiconductor devices as long as the semiconductor devices has a MIS structure at a surface inclined at 0 degrees or more and 10 degrees or less to the {000-1} face or a surface with a normal direction inclined at 80 degrees or more and 90 degrees or less to the <000-1> direction.

While certain embodiments have been described, these embodiments have been presented by way of example only, and are not intended to limit the scope of the inventions. Indeed, a semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a SiC layer including a first region provided at a surface, the first region satisfies $N_A - N_D < 5 \times 10^{15}$ cm$^{-3}$ when a concentration of a p-type impurity is denoted by $N_A$, whereas a concentration of an n-type impurity is denoted by $N_D$, the surface being inclined at 0 degrees or more and 10 degrees or less to a {000-1} face, or the surface having a normal direction inclined at 80 degrees or more and 90 degrees or less to a <000-1> direction;
    a gate electrode;
    a gate insulating film provided between the SiC layer and the gate electrode; and
    a second region provided between the first region and the gate insulating film, the second region having a nitrogen concentration higher than $1 \times 10^{22}$ cm$^{-3}$.

2. The device according to claim 1, wherein the first region is n-type.

3. The device according to claim 1, wherein the first region satisfies $N_A < 5 \times 10^{15}$ cm$^{-3}$.

4. The device according to claim 1, wherein a concentration of aluminum in the first region is less than $5 \times 10^{15}$ cm$^{-3}$.

5. The device according to claim 1, wherein a distance is 10 nm or less from the gate insulating film to a location where the concentration of nitrogen is $1 \times 10^{19}$ cm$^{-3}$ or less in the second region.

6. The device according to claim 1, wherein the SiC layer further comprising:
   a base region having p-type impurity concentration of $1 \times 10^{16}$ cm$^{-3}$ or more, the first region provided between the base region and the gate insulating film;
   an n-type source region provided at the surface; and
   an n-type drift region, the base region provided between the n-type source region and the n-type drift region.

7. The device according to claim 1, wherein the first region is 20 nm or less in width.

8. The device according to claim 1, wherein the gate insulating film is a silicon oxide film or a silicon nitride film.

9. The device according to claim 1, wherein the surface having the normal direction inclined at 80 degrees or more and 90 degrees or less to the <000-1> direction is a surface inclined at 0 degrees or more and 10 degrees or less to a {1-100} face, or a surface inclined at 0 degrees or more and 10 degrees or less to a {11-20} face.

10. The device according to claim 1, wherein the first region contains nitrogen.

* * * * *